(12) United States Patent
Wilhelm

(10) Patent No.: US 9,568,510 B2
(45) Date of Patent: Feb. 14, 2017

(54) SYSTEM AND METHOD FOR MONITORING A THREE-PHASE NETWORK

(71) Applicant: Steffen Wilhelm, Magnolia, TX (US)

(72) Inventor: Steffen Wilhelm, Magnolia, TX (US)

( * ) Notice: Subject to any disclaimer, the term of this patent is extended or adjusted under 35 U.S.C. 154(b) by 176 days.

(21) Appl. No.: 14/329,998

(22) Filed: Jul. 14, 2014

(65) Prior Publication Data
US 2016/0011243 A1    Jan. 14, 2016

(51) Int. Cl.
*G01R 31/327*    (2006.01)
*G01R 19/165*    (2006.01)
*G01R 19/00*    (2006.01)

(52) U.S. Cl.
CPC ..... *G01R 19/16547* (2013.01); *G01R 19/0084* (2013.01)

(58) Field of Classification Search
CPC ............ G01R 19/16571; G01R 31/333; G01R 31/327; H02P 29/0241; H02P 29/0243; H02P 29/027; H04M 1/745; H04M 2201/80; B64D 45/02; F03D 80/30; H01R 13/6666; H01R 24/48; H01R 9/2641; H01R 9/2441; H01T 4/00; H02K 11/26; H03K 17/08
See application file for complete search history.

(56) References Cited

U.S. PATENT DOCUMENTS

| | | | | |
|---|---|---|---|---|
| 5,448,442 A | * | 9/1995 | Farag | H02P 1/26 361/24 |
| 5,737,168 A | * | 4/1998 | Baker | H02H 3/207 361/84 |
| 5,748,093 A | * | 5/1998 | Swanson | H02H 9/042 340/635 |

* cited by examiner

*Primary Examiner* — Son Le
*Assistant Examiner* — Brent J Andrews
(74) *Attorney, Agent, or Firm* — Spradley PLLC; Michael Spradley

(57) ABSTRACT

A power-monitoring system and method is disclosed. The power monitoring system can comprise a surge arrester, a voltage-monitoring relay, a K1 relay, a reset switch, a K1 switch, a K2 relay, an F1 switch, a K2 switch, and a machine communication port. The K1 relay can activate when voltage-monitoring relay detects an electrical issue. The K2 relay can activate when surge arrester detects a current spike. A method for monitoring power is also disclosed. A surge arrestor and power-monitoring relay can monitor a supply line. The voltage-monitoring relay can activate K1 relay when it detects an electrical issue. The surge arrester can activate K2 relay when it detects a current surge.

18 Claims, 9 Drawing Sheets

SYSTEM AND METHOD FOR MONITORING A THREE-PHASE NETWORK

BACKGROUND

This disclosure relates to a system and method for monitoring a three-phase network.

Methods for monitoring three-phase network have evolved over the years. Presently, power arrives at a facility at the facility's main panel. Between the main panel and main switch fuses or a surge protector are installed. After the main switch, a transformer steps the voltage down before the power reaches the load.

Presently, a system and method for monitoring the electric network, lighting potential bonding, and surge protection, between the transformer and load does not exist, even though such monitoring could be more effective and less expensive.

As such it would be useful to have an improved system and method for monitoring a three-phase network.

SUMMARY

A power-monitoring system is disclosed. The power monitoring system can comprise a surge arrester, a voltage-monitoring relay, a K1 relay, a reset switch, a K1 switch, a K2 relay, an F1 switch, a K2 switch, and a machine communication port. The surge arrester can be electrically connected to a three-phase supply line. The surge arrester can be capable of recognizing a spike. Further as a result of the spike can be capable of activating an F1 relay. The voltage-monitoring relay can be connected to the supply line. The K1 relay can be controllable by the voltage-monitoring relay. The K1 relay can be activated by the voltage-monitoring relay when the voltage-monitoring relay detects an electrical issue with the supply line. The reset switch can be biased in a closed position. The K1 switch can comprise a first K1 terminal connected to a K1 biased open position and a second K1 terminal connected to a K1 biased closed position. The first K1 terminal in series with the reset switch, further the K1 switch and the reset switch can be electrically connected between a power source and the K1 relay, such that when K1 switch is closed by activating K1 relay, the K1 relay can remain activated by the K1 switch until the reset switch is pushed to an open position. The F1 switch in a biased open position. The F1 switch can be controllable by the F1 relay. The F1 switch can be in series with the K2 relay. The K2 relay can be inactive when the F1 switch is in an open position and active when the F1 switch is in a closed position. The K2 switch can comprise a first K2 terminal connected to a K2 biased open position and a second K2 terminal connected to a K2 biased closed position. The K2 switch can be controllable by the K2 relay. The machine communication port, further wired to the K1 switch and the K2 switch, such that the machine communication port is capable of transmitting to a machine the position of the K1 relay and the K2 relay.

A method for monitoring electricity between a transformer and a machine is also disclosed. The method can comprise the steps of monitoring a three-phase power line with a surge arrester, monitoring the power line with a voltage-monitoring relay, and activating a K1 relay by the voltage monitoring relay when the voltage-monitoring relay detects an electrical issue on the supply line. Additionally, the method can also comprise the steps maintaining the K1 relay in an activated position using a K1 switch in series with a reset switch biased in a closed position, and power source, and deactivating the K1 relay by pressing the reset button when the voltage-monitoring relay no longer detects the electrical issue. Lastly, the steps can also comprise communicating the status of the K1 relay to a machine through a machine communication port.

DETAILED DESCRIPTION

Described herein is a system and method for monitoring a three-phase network. The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

Figure 1:
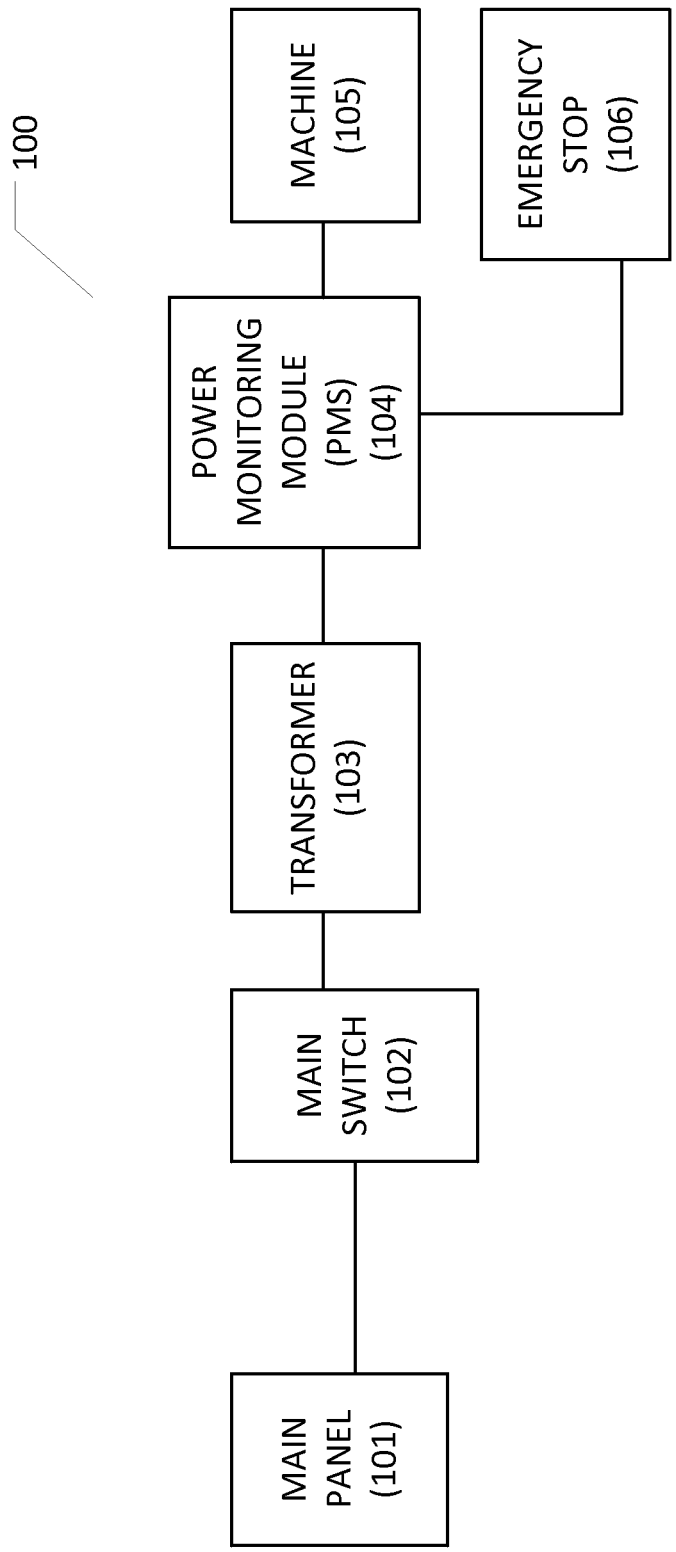
FIG. 1 illustrates an electricity supply system for monitoring a three-phase network.

FIG. 1 illustrates an electricity supply system 100 for monitoring a three-phase network. In electricity supply system 100, electric power can come to a facility from a main panel 101, to a main switch 102, then goes to a transformer 103 before going to a machine 105. In this embodiment, a power monitoring system (PMS) module 104 can be installed and connected between transformer 103 and machine 105. For purposes of this disclosure, main panel 101 can be a device made of a metal box that holds overload protection devices for a facilities electrical branch circuit.

Main switch 102 can be a component of electricity supply system 100 that divides electrical power feed into subsidiary circuits. Main switch 102 can also provide a protective fuse for each circuit within main switch 102. Transformer 103 can be used to reduce or increase the voltage of an alternating current. Machine 105 can be related to any device or equipment that requires an amount of electric power to operate. Furthermore, machine 105 can be referred to as a load, which is a part of electricity supply system 100 that converts electric power into light, heat or mechanical motion. Further, PMS module 104 can be a device that is used to measure, monitor, identify, and control sources of energy consumption. Moreover, PMS module 104 can constantly monitor phase voltages, phase sequence, symmetry and the presence of all phases. Furthermore, PMS module 104 can comprise an emergency stop component 106. Emergency stop component 106 can shutdown or stop the operation of machine 105 as directed by PMS module 104.

Figure 2:
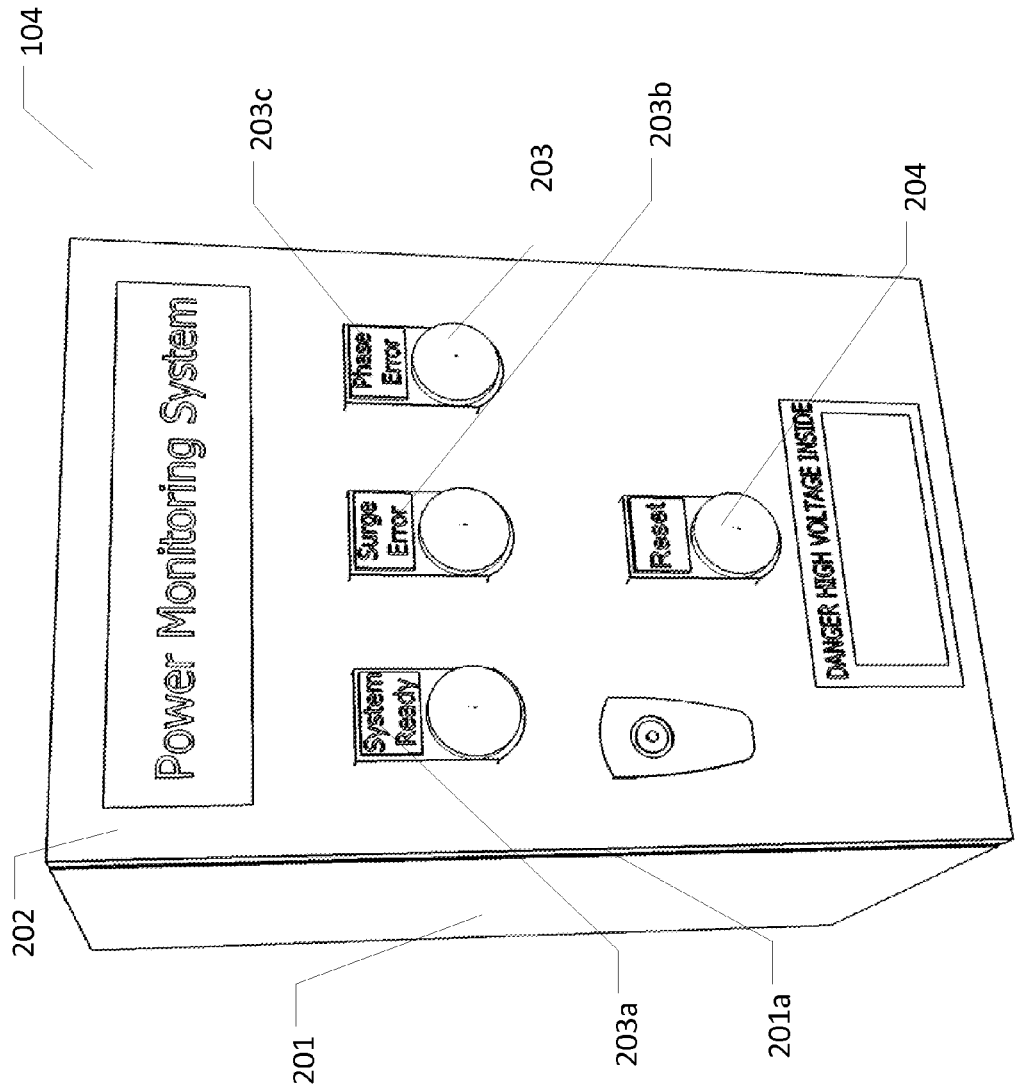
FIG. 2 illustrates a power monitoring system (PMS) module comprising an enclosure, and a lid.

FIG. 2 illustrates a PMS module 104 comprising an enclosure 201, and a lid 202. Enclosure 201 can have a rectangular form that protects and houses electrical components of PMS module 104. As such, enclosure 201 can comprise an opening 201a that allows user to access electrical components within enclosure 201. Lid 202 can be a cover that is mountable at opening 201a. As such, lid 202 can serve as a removable or hinged opening for enclosure 201. Further, the outer surface of lid 202 can comprise a plurality of indicators 203 and a reset button 204. indicators 203 can comprise a system ready indicator 203a, a error indicator 203b, and a phase error indicator 203c. Thus, lights can be observed from indicators 203 to show the status of PMS module 104. Reset button 204 when actuated can allow PMS module 104 to reset operation.

Figure 3:
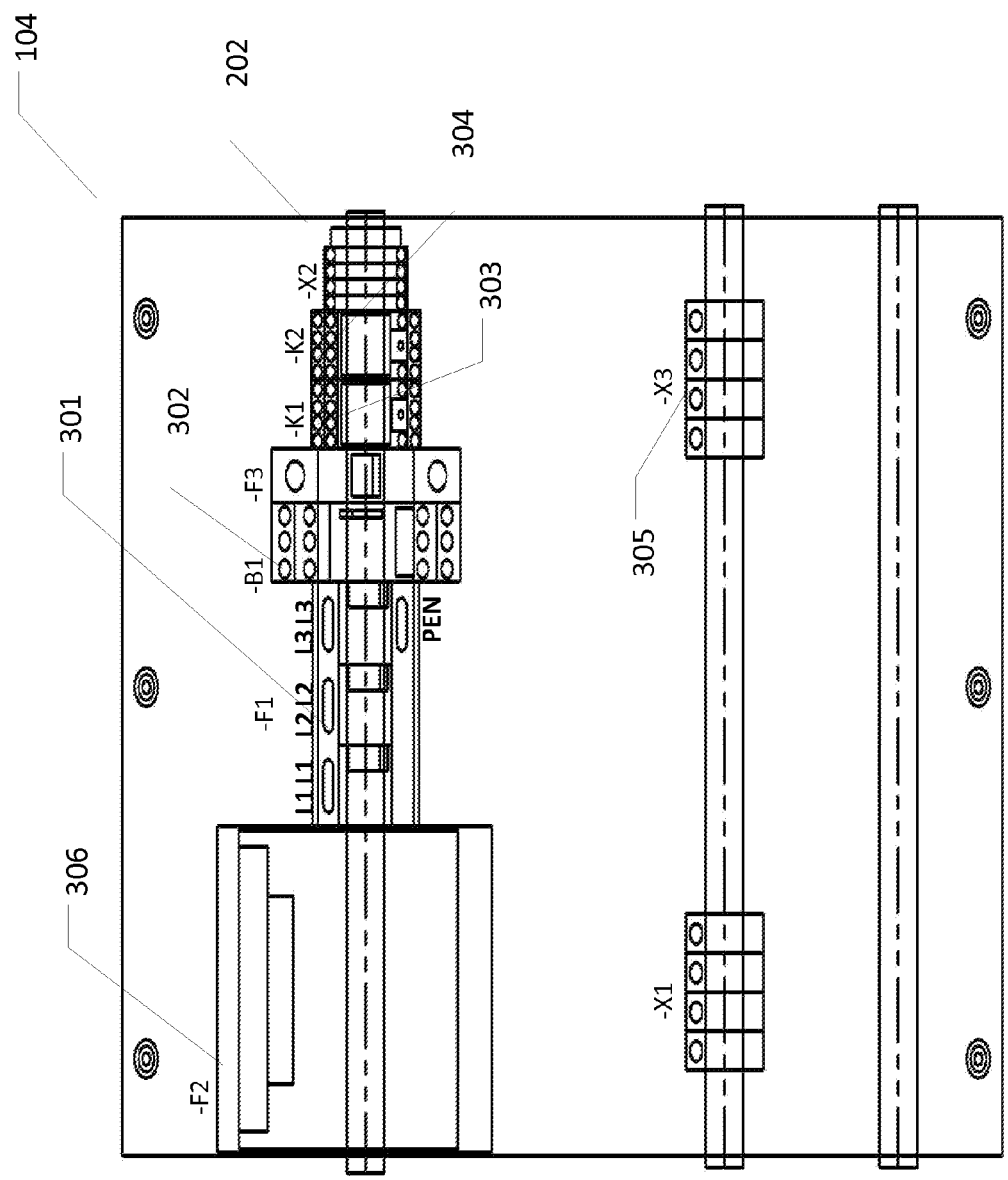
FIG. 3 illustrates a PMS module further comprising a plurality of various electrical components mounted within enclosure including, but not limited to, a surge arrester, a voltage monitoring relay, a K1 switch and relay system, a K2 switch and relay system, a machine communication port, and a control fuse.

FIG. 3 illustrates a PMS module 104 further comprising a plurality of various electrical components mounted within enclosure 201 including, but not limited to, a surge arrester 301, a voltage-monitoring relay 302, a K1 switch and relay system 303, a K2 switch and relay system 304, a machine communication port 305, and a control fuse 306. In one embodiment, surge arrester 301 can be a type 4 surge protective device for SPD Type 2 that includes but is not limited to DEHNventil M series, DEHNventil DV MOD 255 series, or a DEHNsecure DSE MOD series. Surge arrester 301 can recognize severe current spikes, such as from lightning strikes, and can communicate this recognition by relay to other parts of the circuit within PMS module. Voltage monitoring relay 302 can be a multi-functional monitoring relay for three-phase mains. As such, voltage-monitoring relay 302 can be a CM range three-phase monitors such as CM-MPS.11, CM-MPS.21, CM-MPS.31, and CM-MPS.41.

Figure 4:
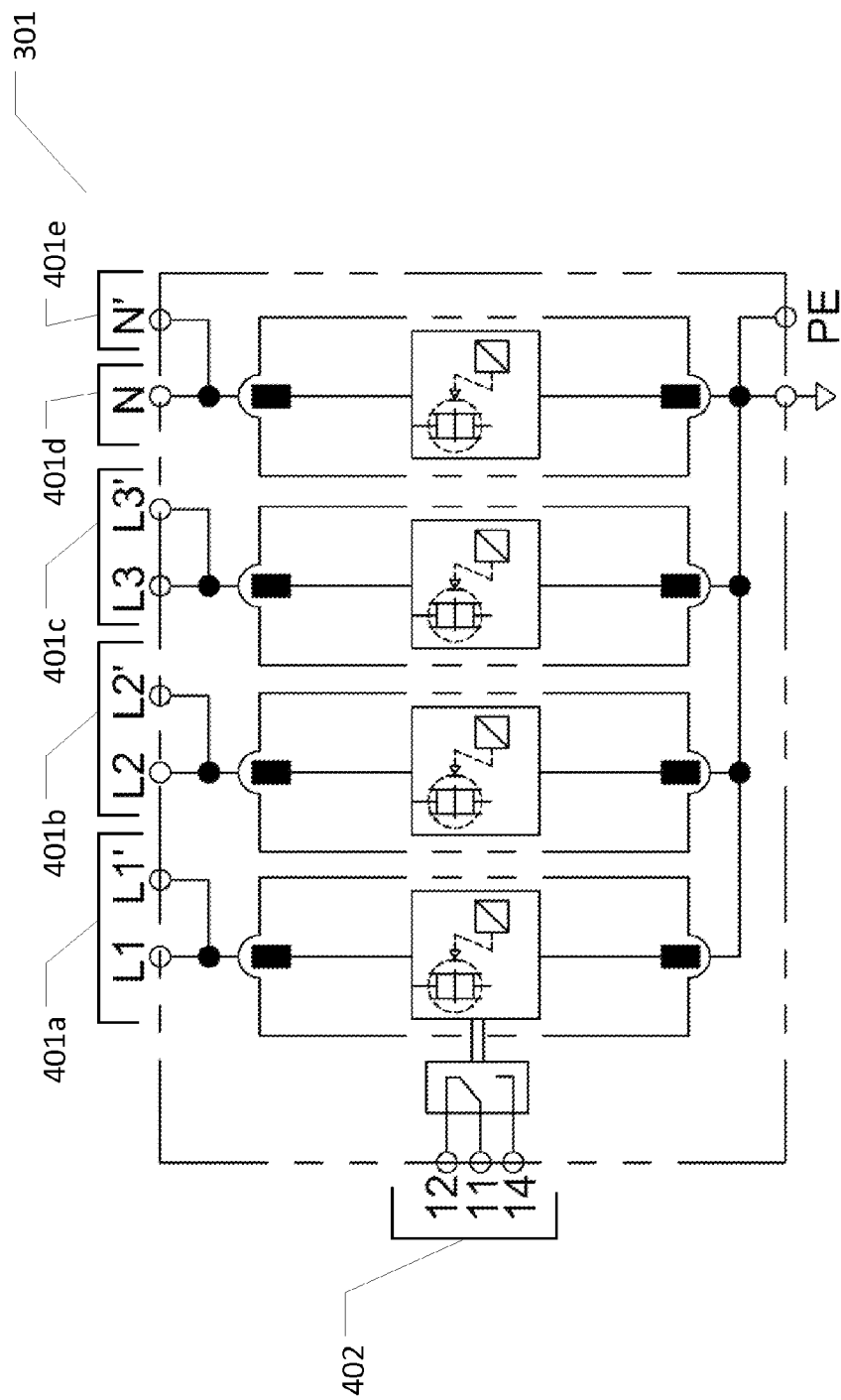
FIG. 4 illustrates a surge arrester.

FIG. 4 illustrates a surge arrester 301. In one embodiment, surge arrester 301 can be a prewired spark-gap-based combined lightning current and surge arrester that is used for TN-S systems. In another embodiment, surge arrester 301 can be a modular combined lightning current and surge arrester for protecting TN-C systems. In these embodiments, surge arrester 301 can be a DV M TNS 255 FM (951 405), DV M TNC 255 FM, or a DV M TNC 255. Further, surge arrester 301 can be used to allow the three-phase system to use a higher voltage while still supporting lower voltage single-phase device.

In this embodiment, surge arrester 301 can comprise a plurality of surge arrester connection points 401, and a surge arrester switch and relay system 402. Surge arrester connection points 401 can comprise an L1 connection point 401a, an L2 connection point 401b, an L3 connection point 401c, a neutral connection point 401d, and a ground connection point 401e. Surge arrester relay and switch system 402 can change the position of switch when triggered. As such, when PMS module 104 detects a current spike, surge arrester relay and switch system 402 can activate and switch. When such scenario occurs, a user can open PMS module 104 to reset surge arrester 301, which can allow PMS module 104 to proceed to its monitoring operation again.

Figure 5:
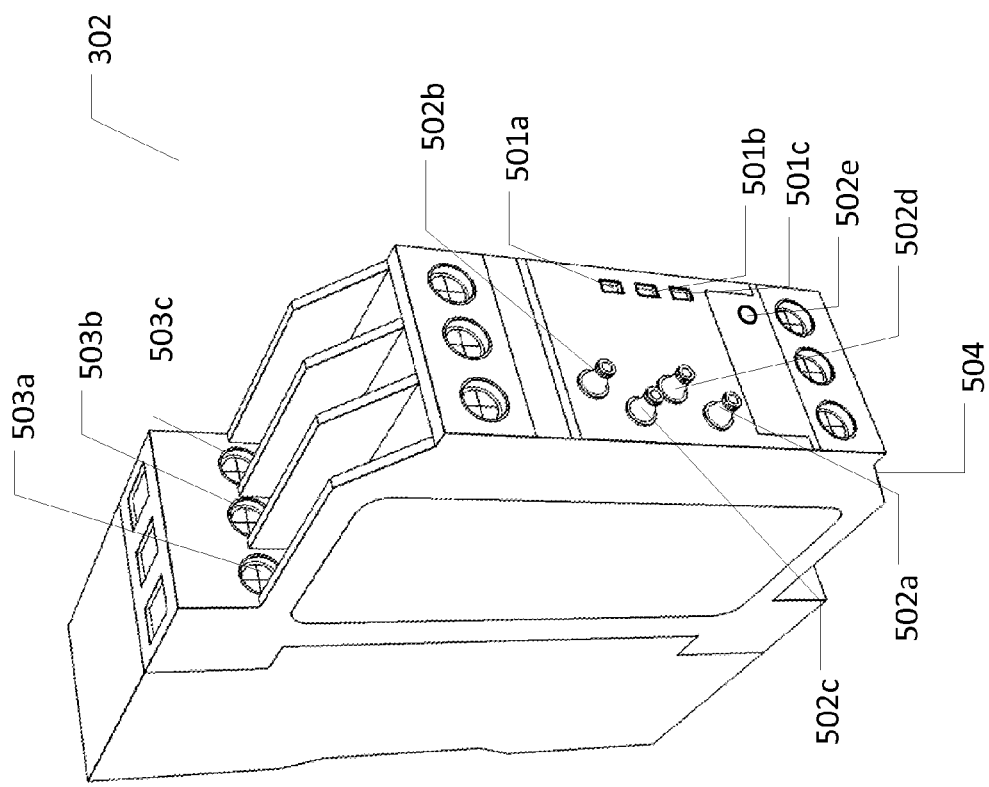
FIG. 5 illustrates an embodiment of a voltage-monitoring relay.

FIG. 5 illustrates an embodiment of voltage-monitoring relay 302. Voltage-monitoring relay 302 can comprise a plurality of indicator relay statuses 501, a plurality of adjustment actuators 502, line terminals 503, and a phase warning port 504. Indicator relay status 501 can be used for status indication of voltage-monitoring relays 302. Indicator relay status 501 can comprise an R/T indicator 501a, an F1 indicator 501b, and an F2 indicator 501c. RT indicator 501a can be indicated with a yellow light that relates to relay status timing. F1 indicator 501b and F2 indicator 501c can be indicated with red lights that relates to fault message. Adjustment actuators 502 can comprise a first actuator 502a, a second actuator 502b, a third actuator 502c, and a fourth actuator 502d. First actuator 502a can be used to adjust tripping delay ($t_v$) while second actuator 502b can be used to adjust threshold value for over voltage. Third actuator 502c can be used to adjust threshold value for under voltage while fourth actuator 502d can be used to adjust threshold for phase unbalance. Lastly, fifth actuator 502e can be used as function selection. Line terminals 503 can be used to connect voltage-monitoring relay 302 with three phase lines (L1, L2, and L3) of a circuit. Phase warning port 504 can indicate when a problem is encountered by voltage-monitoring relay 302. Thus, phase warning port 504 can be connected to a circuit, which can relay the information once a warning is detected.

Further, by means of three separate potentiometers with direct reading scales, the threshold values for over- and under-voltages as well as phase unbalance can be adjusted to be within the measuring range through voltage-monitoring relays 302.

Figure 6:
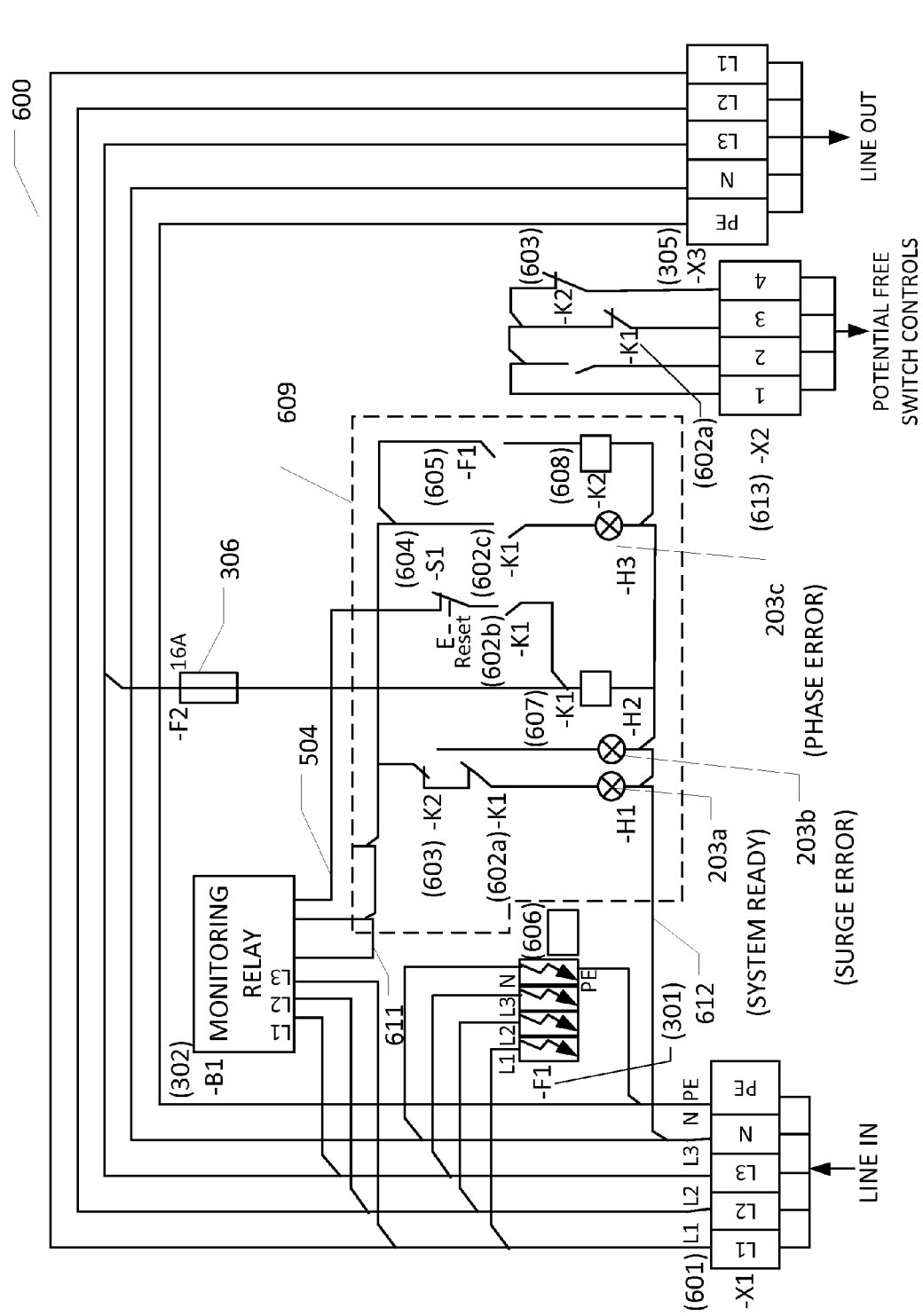
FIG. 6 illustrates a circuit disclosing electrical connections between electrical components of a PMS module, such as LED indicators, surge arrester, voltage-monitoring relay, K1 switch and relay system, and K2 switch and relay system.

FIG. 6 illustrates circuit 600 disclosing electrical connections between electrical components of PMS module 104, such as indicators 203, surge arrester 301, voltage-monitoring relay 302, K1 switch and relay system 303, and K2 switch and relay system 304. Surge arrester relay and switch system 402 that is a component of surge arrester 301 can comprise an F1 switch 605 and an F1 relay 606. K1 switch and relay system 303 can comprise a plurality of K1 switches 602 and a K1 relay 607. Furthermore, K1 switches 602 can comprise a first K1 switch 602a, a second K1 switch 602b, and a third K1 switch 602c. K2 switch and relay system 304 can comprise a K2 switch 603 and a K2 relay 608.

As shown in circuit 600, a supply line 601 can comprise a line for each of three phases (L1, L2, and L3), a neutral line (N), and a ground line (PE). Electric power coming from supply line 601 can go to surge arrester 301 then go through voltage-monitoring relay 302. Surge arrester 301 can be electrically connected to supply line 601 to detect current spikes. Surge arrester relay and switch system 402 on surge arrester 301 can be capable of controlling F1 switch 605. By controlling F1 switch 605, surge arrester 301 can communicate if a high current spike occurred. Voltage-monitoring relay 302 can also be connected to supply line 601 to monitor phase sequence, phase failure, over-voltage, under-voltage, and/or phase imbalance. If voltage-monitoring relay 302 detects one or more of these problems, it can transmit a phase warning from phase warning port 504.

Circuit 600 can comprise a switch and relay network 609 in communication with surge arrester 301 and voltage-monitoring relay 302. In one embodiment, switch and relay network 609 can be at least partially powered by supply line 601. Control fuse 306 that is between switch and relay network 609 and supply line 601 can protect switch and relay network 609. Switch and relay network 609 can comprise a hot node 611 created by its connection with supply line 601 and a neutral node 612 created by a second connection to supply line neutral line.

System ready indicator 203a can be connected in series with first K1 switch 602a biased to a closed position, and K2 switch 603 biased to a closed position, all between hot node 611 and neutral node 612. Surge error indicator 203b can be connected in series with K2 switch 603 biased in an open position, both between hot node 611 and neutral node 612. Phase error indicator 203c can be connected with third K1 switch 602c biased to an open position, between hot node 611 and neutral node 612. K2 relay 608 can be connected in series to F1 switch 605 biased in an open position, both between hot node 611 and neutral node 612. K1 relay 607 can connect to neutral node 612 and to phase warning port 504. The non-neutral side of K1 relay 607 can also be wired to second K1 switch 602b in a biased open position in series with a reset switch 604 in a biased closed position.

Circuit 600 can also comprise an emergency stop 613 and machine communication port 305. As such, F1 relay 606, K1 relay 607, and K2 relay 608 can be connected to the control lines of emergency stop 613. Machine communication port 305 can be wired to machine 105 to communicate information received from emergency stop 613.

In a scenario wherein no problem is encountered during monitoring stage, no relay is activated, and F1 relay 606, K1 relay 607, and K2 relay 608 will not be activated, leaving all switches remain in their biased position, as illustrated in FIG. 6. Therefore, K2 switch 603 and first K1 switch 602a in series with system ready indicator 203a can remain closed. The position of switches 603 and 602a can then allow current to pass through, thus allowing lights on system ready indicator 203a to turn on. As such, a steady light can be seen from system ready indicator 203a as long as no error is detected during the monitoring stage.

In another scenario wherein voltage-monitoring relay 302 detects a problem, voltage-monitoring relay can send a signal to K1 relay 607. Once K1 relay 607 is triggered, first K1 switch 602a, second K1 switch 602b, and third K1 switch 602c can change position. As such, first K1 switch 602a can be in an open position, second K1 switch 602b can now be in a close position, and third K1 switch 602c can also be in close position. In practice, first K1 switch 602a, second K1 switch 602b, and third K1 switch 602c can be the same K1 switch 602 with a first terminal wired to a biased open position, and a second terminal biased to a biased closed position. Thus, to say that K1 switch 602a is in an open position means that system ready indicator 203a is wired to the first terminal of K1 switch 602. Further, K1 relay, while represented as two items in FIG. 6, can be features of one physical device. Reset switch 604 can still be at a biased closed state in this scenario. Therefore in such scenario, the power coming from control fuse 306 can pass through S1 reset switch 604 and second K1 switch 602b thus, powering K1 relay 607. As such, K1 relay 607 can be kept activated since power can continuously pass through control fuse 306, S1 reset switch 604 and second K1 switch 602b. Further, first K1 switch 602a that is now in an open position can cause lights on system ready indicator 203a to turn off. Furthermore, third K1 switch 602c that is now in a close position can allow lights on phase error indicator 203c to turn on. Moreover, as long as an error condition can be detected at the monitoring stage, third K1 switch 602c can be kept activated that can also keep the lights on phase error indicator 203c turned on.

To reset PMS module 104, a user can push reset button 204. This can cause the power coming from control fuse 306 going to K1 relay 607 to be cut off. As such, if no warning is detected from voltage-monitoring relay 302 then K1 relay 607 will not be triggered. This can cause K1 switches to go back to biased position, wherein first K1 switch 602a can be closed while second K1 switch 602b and third K1 switch 602c can be opened. At this state, the power can flow from control fuse 306 and go through first K1 switch 602a allowing lights on system ready indicator 203a to turn on again, while lights on phase error indicator 203c can turn off.

Further in another scenario once lightning or another high current surge is detected from surge arrester 301, information can be sent to switch and relay network 609. This can activate F1 relay 606 causing F1 switch 605 to change position from open to close. As such, power coming from control fuse 306 to go through k2 relay 608, thus activating K2 relay 608 and causing K2 switch 603 to change position. Therefore, electricity can flow to surge error indicator 203b, which can cause surge error indicator 203b to turn on, and cause the light on system indicator 203a to turn off.

Surge arrester relay and switch system 402 can also send signals to machine 105 through machine communication port 305. As such, machine 105 can vary or cease its operation in the event a phase warning or current spike is detected. K1 switches 602, and K2 switch 603 can be wired to machine communication port 305 to communicate when such errors occur.

Figure 7A:
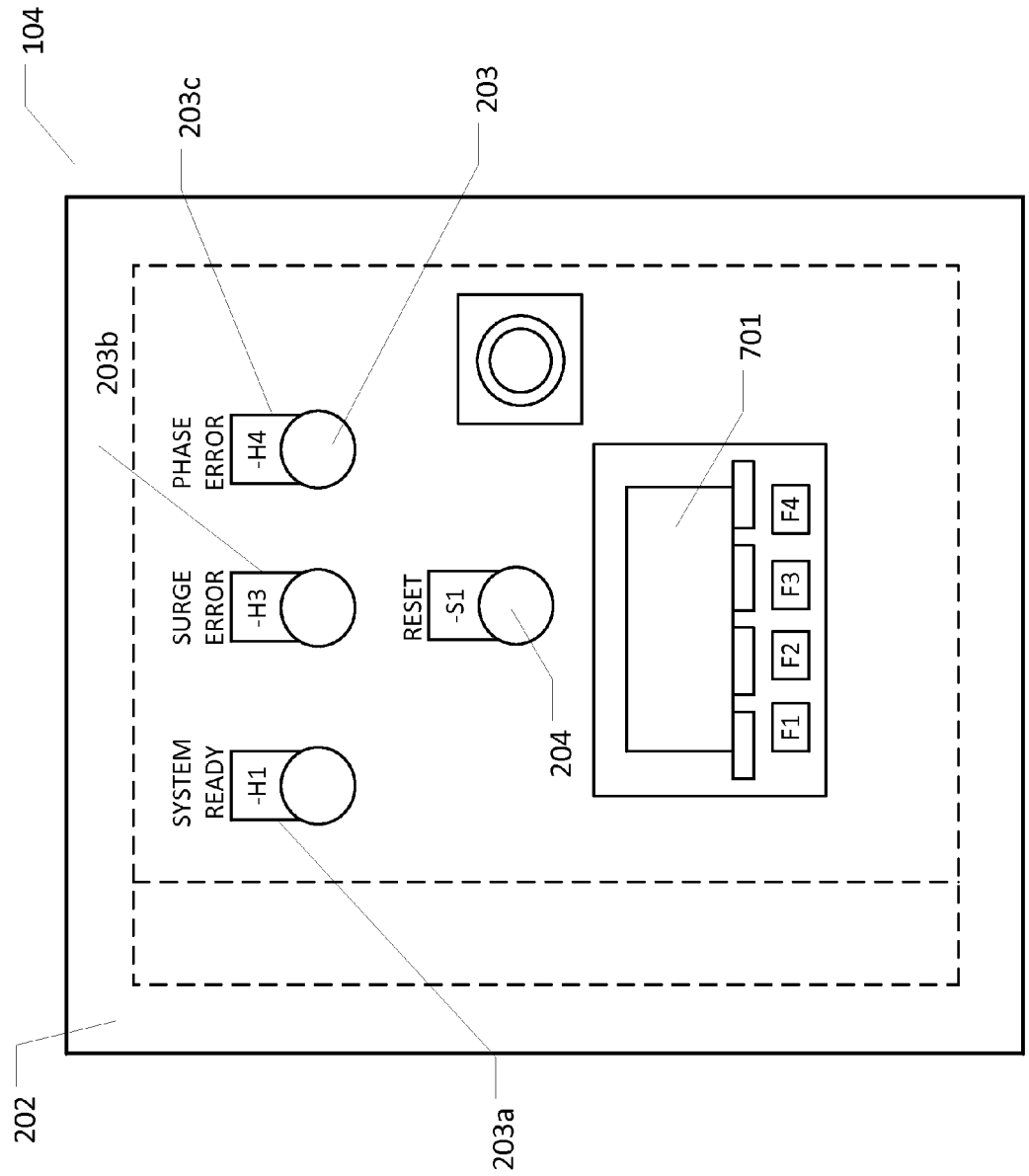
FIG. 7A illustrates another embodiment of PMS module further comprising a screen.

FIG. 7A illustrates another embodiment of PMS module 104 further comprising a screen 701. Screen 701 can be placed at the outer surface of lid 202. In this embodiment, screen 701 can be a component of a power monitoring device. As such, screen 701 can be capable of displaying information received from PMS module 104 that can include but is not limited to current measurement, voltage metering, phase error status, surge error statuses, and system ready statuses.

Figure 7B:
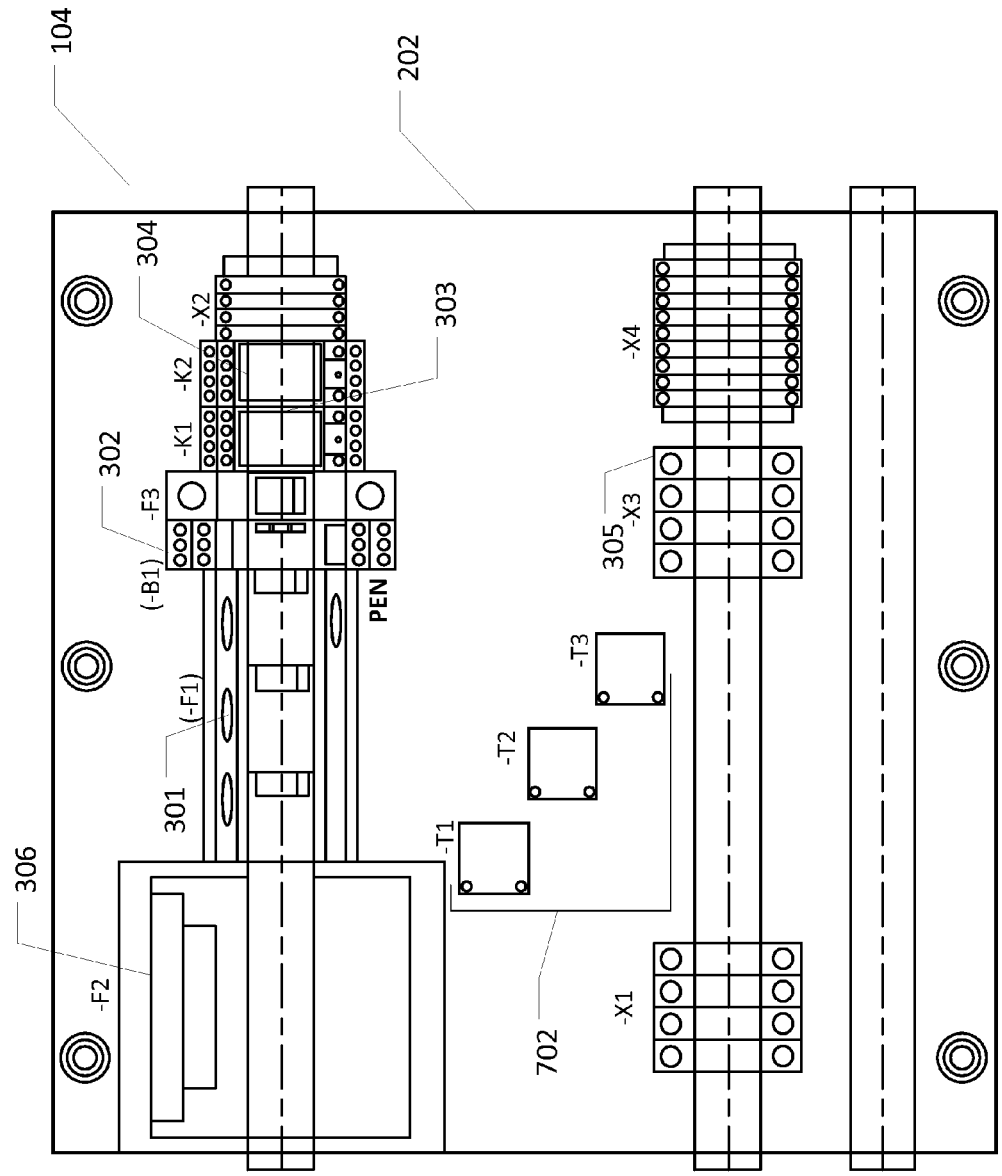
FIG. 7B illustrates electrical components of PMS module that comprises screen.

FIG. 7B illustrates electrical components of PMS module 104 that comprises screen 701. In this embodiment, PMS module 104 can further comprise a current transformer 702. Current transformer 702 can be used for measuring alternating electric currents. Moreover, current transformer 702 can produce reduced current when current in a circuit is too high to apply directly to a measuring device.

Figure 7C:
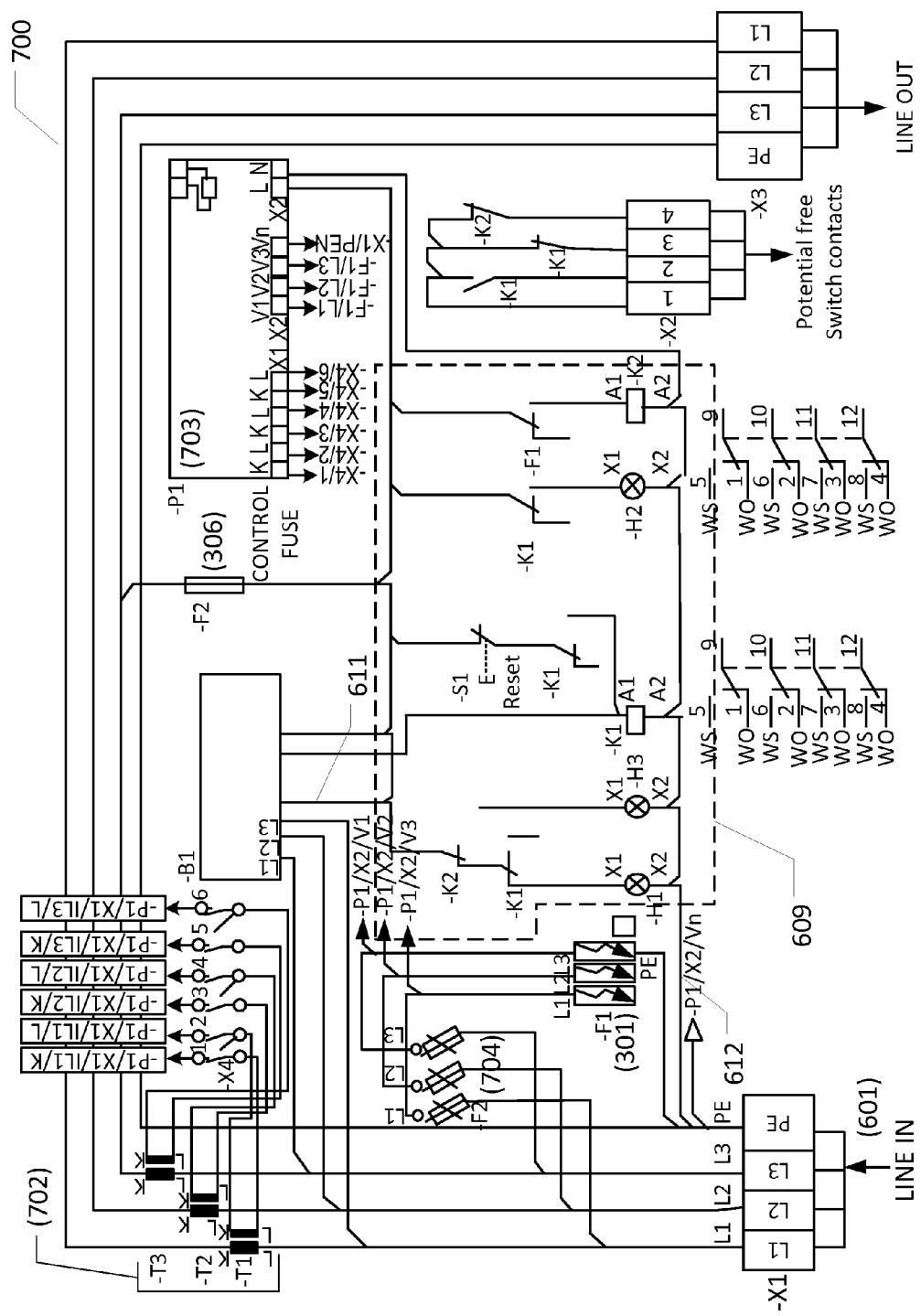
FIG. 7C illustrates a circuit disclosing electrical connections between components of PMS module that comprises screen.

FIG. 7C illustrates a circuit 700 disclosing electrical connections between components of PMS module that comprises screen 701. In such embodiment, circuit 700 can further comprise current transformer 702, a P1 measurement device 703, and a fuse isolator switch 704. P1 measurement device 703 can be a power monitoring device used for single and multiphase mains. Moreover, P1 measurement device 703 can provide measurement values for power detection. Additionally, P1 measurement device 703 can be integrated with a communication interface such as screen 701, and digital actuators. Therefore, allowing user to adjust PMS module 104 through screen 701.

In this embodiment, supply line 601 can comprise three-phase line (L1,L2, L3), and a combined ground and neutral line (PEN). In such embodiment, fuse isolator switch 704 can be connected between supply line 601 and surge arrester 301. Current transformer 702 can be connected between supply line 601 and machine communication port 305.

Moreover, power coming from supply line can pass through current transformer 702 before going through a control fuse 305. P1 measurement device 701 can be connected between hot node 611 and neutral node 612.

In this embodiment, measurement values of power detected on circuit 700 can be displayed and monitored through screen 701 of P1 measurement device 703. As such, measurements of power detected from supply line 601 can be displayed and monitored through screen 701 of P1 measurement device 703. Moreover, fuse isolator switch 704, and current transformer 702 can provide additional protection for PMS module 104 from high current spikes and other electrical issues.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A power monitoring system (PMS) module installable between a transformer and a machine, said PMS module comprising
   a surge arrester electrically connected to a three-phase supply line, said surge arrester capable of recognizing a spike, further as a result of said spike capable of activating an F1 relay;
   a voltage-monitoring relay connected to said supply line;
   a K1 relay controllable by said voltage-monitoring relay, said K1 relay activated by said voltage monitoring relay when said voltage monitoring relay detects an electrical issue with said supply line;
   a reset switch biased in a closed position;
   a k1 switch comprising a first K1 terminal connected to a K1 biased open position and a second K1 terminal connected to a K1 biased closed position, said first K1 terminal in series with said reset switch, further said k1 switch and said reset switch electrically connected between a power source and said k1 relay, such that when k1 switch is closed by activating k1 relay, said k1 relay remains activated by said k1 switch until said reset switch is pushed to an open position;
   a K2 relay;
   an F1 switch in a biased open position, said F1 switch controllable by said F1 relay, said F1 switch in series with said K2 relay, said K2 relay inactive when said F1 switch is in an open position and active when said F1 switch is in a closed position;
   a k2 switch comprising a first K2 terminal connected to a K2 biased open position and a second K2 terminal connected to a K2 biased closed position, said k2 switch controllable by said K2 relay; and
   a machine communication port, further wired to said K1 switch and said k2 switch, such that said machine communication port is capable of transmitting to a machine the position of said K1 relay and said K2 relay.

2. The system of claim 1 comprising a system ready indicator connected in series with said second K1 terminal and said second K2 terminal.

3. The system of claim 1 comprising a phase error indicator in series with said first K1 terminal.

4. The system of claim 1 comprising a surge error indicator in series with said first K2 terminal.

5. The system of claim 1 wherein said machine communication port is connected to said first K1 terminal.

6. The system of claim 1 wherein said machine communication port is connected to said second K1 terminal.

7. The system of claim 1 wherein said machine communication port is connected to said first K2 terminal.

8. The system of claim 1 wherein said machine communication port is connected to said second K2 terminal.

9. The system of claim 1 comprising a use between said power source and said k1 relay.

10. The system of claim 1 comprising an enclosure that houses said surge arrester, said voltage-monitoring relay, said K1 relay, said K2 relay, said K1 switch, and said K2 switch.

11. A method for monitoring electricity between a transformer and a machine comprising the steps
    monitoring a three-phase power line with a surge arrester
    monitoring said power line with a voltage monitoring relay;
    activating a K1 relay by said voltage monitoring relay when said voltage monitoring relay detects an electrical issue on said supply line;
    maintaining K1 relay in an activated position using a K1 switch in series with a reset switch biased in a closed position, and power source;
    deactivating said K1 relay by pressing said reset button when said voltage monitoring relay no longer detects said electrical issue; and
    communicating the status of said K1 relay to a machine through a machine communication port.

12. The method of claim 11 wherein the status of said K1 relay is communicated to said machine communication port using a K1 switch controlled by said K1 relay.

13. The method of claim 11 further comprising the step of activating a K2 relay when a surge arrester detects a current surge.

14. The method of claim 13 further comprising the step of communicating the status of said K2 relay to a machine communication port.

15. The method of claim 14 wherein the status of said K2 relay is communicated to said machine communication port using a K2 switch controlled by said K2 relay.

16. The method of claim 11 comprising the step of turning off a system ready indicator whenever either K1 relay or K2 relay is activated.

17. The method of claim 11 further comprising the step of turning on a phase error indicator when K1 relay is activated.

18. The method of claim 11 further comprising the step of turning on a surge error indicator when K2 relay is activated.

* * * * *